(12) United States Patent
Muniraju et al.

(10) Patent No.: US 7,365,535 B2
(45) Date of Patent: Apr. 29, 2008

(54) CLOSED-LOOP MAGNETIC SENSOR SYSTEM

(75) Inventors: Raghavendra Muniraju, Bangalore (IN); Gangi Rajula Reddy, Bangalore (IN); Saravanan Sadasivan, Bangalore (IN); Basavaraja M. Teli, Bangalore (IN); Sudheer Pulikkara Veedu, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/287,326

(22) Filed: Nov. 23, 2005

(65) Prior Publication Data

US 2007/0114992 A1    May 24, 2007

(51) Int. Cl.
   *G01B 7/14* (2006.01)
   *G01B 7/30* (2006.01)
(52) U.S. Cl. ............... 324/252; 324/207.21; 324/225; 324/202
(58) Field of Classification Search ............... 324/252, 324/202, 207.21, 225
   See application file for complete search history.

(56) References Cited

U.S. PATENT DOCUMENTS

| | | | |
|---|---|---|---|
| 4,596,950 A | 6/1986 | Lienhard et al. | |
| 4,821,560 A | 4/1989 | Kohlbauer | .................. 73/117.3 |
| 5,416,407 A * | 5/1995 | Drafts | ..................... 324/117 H |
| 5,488,294 A | 1/1996 | Liddell et al. | ......... 324/207.21 |
| 5,596,272 A | 1/1997 | Busch | .................... 324/207.21 |
| 5,631,557 A | 5/1997 | Davidson | ..................... 324/174 |
| 5,648,719 A | 7/1997 | Christensen et al. | ... 324/207.26 |
| 5,667,879 A | 9/1997 | Haji-Sheikh | ................. 428/209 |
| 5,694,040 A | 12/1997 | Plagens | .................... 324/207.2 |
| 5,729,128 A | 3/1998 | Bunyer et al. | .............. 324/202 |
| 6,323,634 B1 * | 11/2001 | Nakagawa et al. | ..... 324/117 R |
| 6,323,636 B1 * | 11/2001 | Cattaneo et al. | ............ 324/127 |

(Continued)

FOREIGN PATENT DOCUMENTS

DE    4121374 A1    1/1993

(Continued)

OTHER PUBLICATIONS

H. Lemme, A. P. Friedrich, Sensitec, GmbH, *The Universal Current Sensor*, 16 pages, no date.

*Primary Examiner*—Reena Aurora
(74) *Attorney, Agent, or Firm*—Matthew F. Lambrinos; Luis M. Ortiz; Kermit D. Lopez

(57) ABSTRACT

A closed loop magnetic sensor system for measuring an input magnetic field from a magnetic field source has a compensation circuit, which can be for example a printed wire board, and a magnetic sensor, such as a Magnetoresistive (MR) sensor, for measuring an input magnetic field. Preferably, the magnetic sensor is magnetically coupled to the compensation circuit by arranging the magnetic sensor in an air gap provided in the compensation circuit. The compensation circuit has a compensating conductor, arranged on or in a dielectric medium, which can be configured as a plurality of nested coils. Electrical control circuitry, electrically, coupled to the magnetic sensor and compensating conductor, is adapted and arranged to drive a feedback current through the compensating conductor according to the output of the magnetic sensor such that the input magnetic field is substantially compensated at the magnetic sensor. The magnetic system can serve as current sensor for sensing current through a primary conductor.

19 Claims, 10 Drawing Sheets

U.S. PATENT DOCUMENTS

| | | |
|---|---|---|
| 6,566,856 B2 | 5/2003 | Sandquist et al. ...... 324/117 R |
| 6,768,296 B2 * | 7/2004 | Fiedler et al. .......... 324/117 R |
| 6,903,429 B2 | 6/2005 | Berndt et al. ................ 257/414 |
| 7,126,330 B2 * | 10/2006 | Peczalski et al. ........... 324/247 |
| 2004/0130315 A1 | 7/2004 | Lamb et al. ............. 324/207.2 |

FOREIGN PATENT DOCUMENTS

| | | |
|---|---|---|
| DE | 19834153 A1 | 2/2000 |
| DE | 10240241 A1 | 3/2004 |
| EP | 1450176 A1 | 8/2004 |
| WO | WO 01/33233 A1 | 5/2001 |

* cited by examiner

CLOSED-LOOP MAGNETIC SENSOR SYSTEM

TECHNICAL FIELD

Embodiments are generally related to sensors and applications thereof and, more particularly, to magnetic field sensors for measuring magnetic flux. Embodiments are additionally related to magnetic sensor systems for measuring electrical current flowing in a conductor by sensing the magnetic field generated by the conductor. Additionally, embodiments are related to closed-loop magnetic sensor systems and compensation circuits employed in such systems.

BACKGROUND

Conventional magnetic sensors for measuring current through a conductor include a magnetic circuit in the form of a core of magnetic material provided with an air-gap in which a magnetic field sensor, such as, for example, a Hall Effect sensor, is located. The conductor carrying the current to be measured, often called a "primary conductor", passes through the magnetic circuit one or several times. Typically, such sensors are used in applications in which relatively large electrical currents are measured or in other applications in which simple devices, such as current shunts or transformers, are unsuitable for measuring the current to be measured, for example due to the need for galvanic isolation or the presence of D.C. components in the current.

Closed-loop magnetic sensors for measuring current flow through a conductor generally rely on the principle of current compensation in which the current generated by the primary conductor is compensated by means of current flow driven through a compensating coil, also known as a secondary coil, by an electrical circuit controlled by a magnetic field sensor placed in the magnetic core air-gap. In this way, magnetic sensor functions at the same operating point irrespective of the magnitude of the current being measured so that the non-linearity and temperature dependence of the magnetic sensor becomes irrelevant.

One example of a magnetic sensor for measuring current flow is a closed loop Hall current sensor. The Hall voltage is first highly amplified, and the amplifier's output current then flows through a compensation coil on the magnetic core. It generates a magnetization whose amplitude is the same but whose direction is opposite to that of the primary current conductor. The result is that the magnetic flux in the core is compensated to zero. Such Hall current sensors are sensitive to short current peaks in the circuit because the hysterisis properties of the magnetic core cause static magnetization in the core which results in a permanent remanence.

Another example of a magnetic sensor for measuring current flow is a closed loop Magnetoresistive current sensor. The Magentoresisitve sensor is also arranged in a magnetic circuit and the aforementioned compensation principle is used. In order to reduce the temperature dependence, the Magnetoresistive sensor is usually configured as a half or a full bridge. In one arm of the bridge, barber poles are placed in opposite directions above the two magnetoresistors, so that in the presence of a magnetic field the value of the first resistor increases and the value of the second decreases.

Closed loop current sensors of the aforementioned types suffer from several major drawbacks. Firstly, there is an inevitable offset current, associated with the effects of the magnetic core, whose amplitude and temperature dependence are subject to significant fluctuations. Secondly, non-linear properties of the magnetic core lead to a non-linear relationship between the primary conductor current, that is, the current being measured, and the compensating or secondary current, rather than a linear relationship more suited to current measurement.

A closed loop Magnetoresistive current sensor typically uses a ferrous core to concentrate the flux on to the magnetoresistive chip. There are many disadvantages of a ferrous core, such as for example, core losses, limited bandwidth, non-linearity, thermal instability, bulk and cost.

Regarding core losses, the magnetic material and core design as well as the current amplitude versus frequency spectra defines the level of core loss. Eddy current losses are proportional to the square of three different parameters: the peak flux density in the core, the frequency of induction and the lamination sheet thickness of the core. Hysteresis losses are proportional to frequency, core volume and the square of peak flux density. The core losses in conventional current sensors result in a temperature rise thereby further contributing to non-linearity and current off-set fluctuation. The bandwidth in a ferrous core is also limited by the core losses.

Yet another drawback of the aforementioned magnetic current sensors is that demand for such sensors using magnetic cores with larger cross sectional area is substantially increasing the dimension and weight of the magnetic sensor and the complexity and cost of the sensor manufacturing process.

There is a continuing need to provide magnetic sensor systems for current sensing, and/or other applications involving magnetic sensing, which are operable with improved linearity and stability. There is also a need to provide magnetic sensor systems which can be manufactured with greater ease and at lower cost.

The embodiments disclosed herein therefore directly address the shortcomings of present magnetic sensor systems providing a magnetic sensor system with improved performance and which is suitable for many price sensitive applications.

BRIEF SUMMARY

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect to provide for improved magnetic sensor systems and parts thereof.

It is another aspect to provide for a magnetic sensor system suitable for measuring electrical current flowing through a conductor.

It is a further aspect of the present invention to provide for a magnetic sensor system at lower cost.

It is yet a further aspect to provide a closed loop magnetic current sensor system having improved operating characteristics including reduced offset current, increased temperature stability and improved bandwidth.

The aforementioned aspects of the invention and other objectives and advantages can now be achieved as described herein. According to one aspect, a closed loop magnetic sensor system for measuring an input magnetic field from a magnetic field source has a magnetic sensor, such as a magnetoresistive (MR) sensor, for measuring the input magnetic field and a compensation circuit, magnetically coupled to the magnetic sensor. The compensation circuit has a compensating conductor arranged on or in a dielectric medium. Electrical control circuitry, electrically coupled to the magnetic sensor and the compensating conductor, is adapted and arranged to drive a feedback current through the compensating conductor according to the output of the magnetic sensor such that the input magnetic field is substantially compensated at the magnetic sensor.

Arranging the compensating conductor in or on a dielectric medium advantageously increases the galvanic isolation between the compensating conductor and the magnetic source. This, in turn, increases the breakdown voltage between the magnetic source and compensating conductor and enables the magnetic senor to sense the input magnetic field with a high sensitivity without requiring the use of a magnetic core.

Preferably, the magnetic sensor can be arranged in an air gap formed in the compensation circuit so as to magnetically couple the magnetic sensor to the compensating conductor.

Advantageously, the development cost and time in assembling the magnetic core in the magnetic sensor system is also eliminated. For example, the process steps of stamping, stacking of laminations, coil winding and core holding are no longer required. The aforementioned magnetic sensor system can be manufactured with a smaller number of materials and associated process costs so that the production yield can be improved. Also, the magnetic sensor system is compact and lightweight and the shape of the magnetic sensor system can be made the same for all the current range compared to present current sensors using a magnetic core.

The compensating conductor can be configured as one or more compensation coils.

The compensation circuit can be a printed wire board (PWB) or printed circuit board (PCB) in which case the compensating conductor is provided in the form of conductive wires or traces, printed on the PWB, and vias linking the conductive traces together. The coils can extend substantially along the length of the PWB and can be nested together.

Providing the magnetic sensor system with at least one compensating conductor coil embedded in the PWB enables the magnetic sensor to sensitively and accurately measure current flowing through the primary conductor without requiring a magnetic core to concentrate the input magnetic field or the compensating magnetic field. Consequently, problems associated with magnetic cores such as, core saturation, residual magnetism, thermal drift, eddy losses are circumvented.

According to another aspect, a closed loop magnetic sensor system for measuring current flowing through a primary conductor has a magnetic sensor, such as a magnetoresistive (MR) sensor, for measuring magnetic flux associated with the primary conductor and a compensation circuit, magnetically coupled to the magnetic sensor. The compensation circuit has a compensating conductor arranged in or on a dielectric medium. The magnetic sensor is arranged in an air gap provided in the compensation circuit such that the sensor can be magnetically coupled to the compensating conductor. Electrical control circuitry, electrically coupled to the magnetic sensor and the compensating conductor, is adapted and arranged to drive a feedback current through the compensating conductor according to the output of the magnetic sensor such that the input magnetic field is substantially compensated at the magnetic sensor.

The compensation circuit can be a printed wire board (PWB) or printed circuit board (PCB) in which case the compensating conductor is provided in the form of conductive wires or traces, printed on the PWB, and vias linking the conductive traces together.

The printed wire board can be shaped as a partial or complete annular or polygonal band such that, when the printed wire board is positioned substantially coaxially with the primary conductor, the printed wire board partially or completely surrounds the primary conductor with a gap formed therebetween.

The printed wire board can have a plurality of stacked layers, each of the stacked layers being separated by dielectric material. The conductive traces can be embedded in the layers and vias can link conductive traces in different layers.

According to yet another embodiment, a compensation circuit board for generating a compensating magnetic field in the vicinity of a magnetic sensor is provided in the form of a printed wire board or printed circuit board having an air gap provided therein for receiving a magnetic sensor for sensing an input magnetic field. A compensating conductor carried on the printed wire board is provided in the form of conductive wires or traces linked together by means of vias. When a magnetic sensor, such as a magnetoresistive (MR) sensor is received in the air gap, the compensating circuit can be driven with current to generate a compensating magnetic field substantially to compensate the input magnetic field at the magnetic sensor.

The compensating conductor can be configured as at least one coil in the printed wire board.

Furthermore, the printed wire board can have a plurality of stacked layers separated by dielectric material. The conductive traces can be arranged in the layers and conductive traces of different layers be linked by the vias to form the coil(s).

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
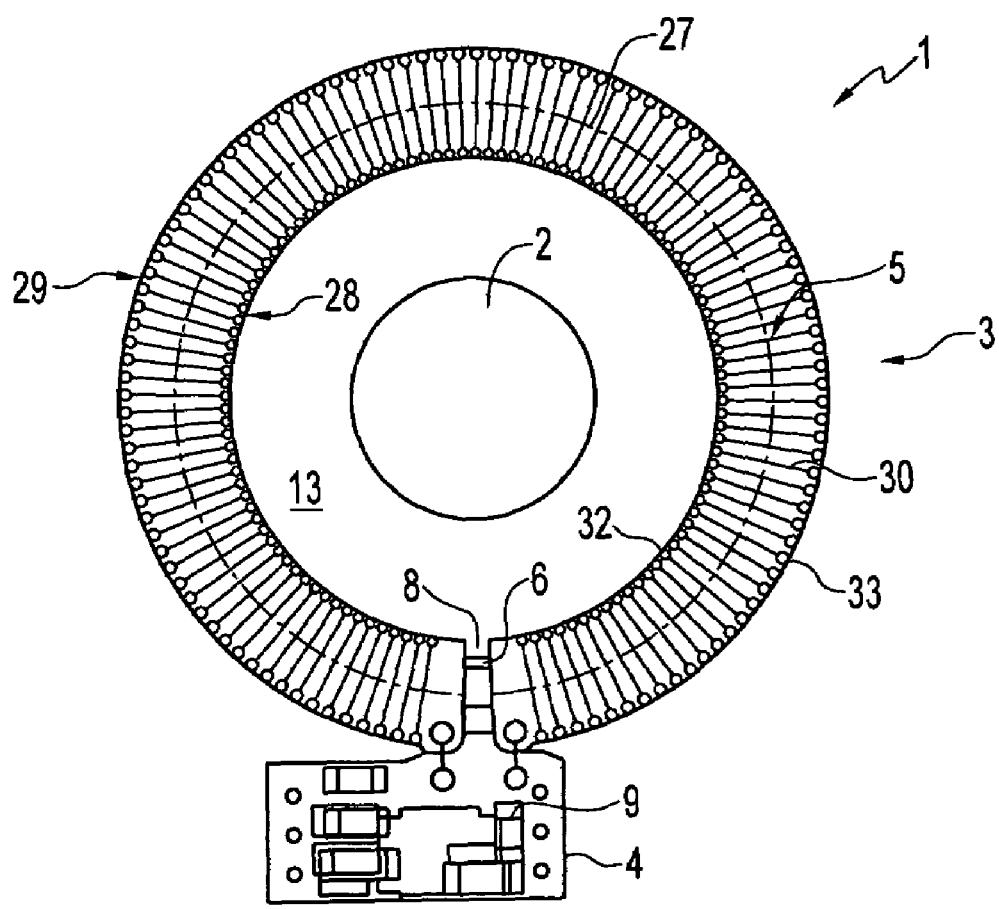
FIG. 1 illustrates a plan view taken from above a closed loop magnetic sensor system including a printed wire board (PWB) for measuring current through a primary conductor according to a preferred embodiment.

Referring to FIG. 1 of the accompanying drawings, which illustrates a plan view of the closed loop magnetic sensor system according to a preferred embodiment, the magnetic sensor system 1 has a magnetic sensor 6 for sensing an input magnetic field generated by a magnetic source 2, and a compensating current carrying conductor 5, magnetically coupled to the magnetic sensor 6, for generating a compensating magnetic field at the magnetic field sensor.

As will be described in more detail below, the compensating conductor 5 is arranged as a series of coils embedded in a dielectric medium. Arranging the compensating conductor 5 in or on a dielectric medium advantageously increases the Galvanic isolation between the compensating conductor 5 and the magnetic source 2, thereby increasing the breakdown voltage between the magnetic source 2 and compensating conductor 5, and enabling the magnetic senor 6 to sense the input magnetic field with a high sensitivity without requiring the use of a magnetic core.

In the embodiment shown in FIG. 1, the magnetic source 2 consists of a cylindrical primary conductor 2 and the magnetic sensor system 1 functions as a current sensor for measuring current flowing through the primary conductor. However, the magnetic field sensed by the magnetic sensor 6 could be generated by means other than the primary current carrying conductor 2, such as, for example, by means of a rotating or stationary magnet. Also, the magnetic sensor 6 shown in FIG. 1 is a Magnetoresistive (MR) sensor, mounted on a circuit board 4, however, other types of highly sensitive magnetic sensors could be adopted for measuring the generated field.

Referring in more detail to the embodiment shown in FIG. 1, the compensating conductor 5 consists of conductive traces or wires 30 printed on a dielectric board and linked to together by vias 33, 32. The resulting structure is a printed wired board (PWB) 3, also known as printed circuit board (PCB), which is fabricated in the shape of an annular band having an annular axis 27 such that, when the cylindrical primary conductor extends coaxially through the PWB annular band 3, an annular air gap 13 separates the primary conductor 2 from the surrounding PWB. Alternatively, the PWB can be a rectangular band for applications in which the primary conductor has a rectangular cross-section, or any other shaped band to match the cross-sectional shape of the primary conductor in a particular application to enable high flux linkage at higher frequencies. Whilst the PWB 3 shown in FIG. 1 carries the compensating conductor 5, the compensating conductor could be carried on or arranged in other dielectric mediums including air.

Figure 2:
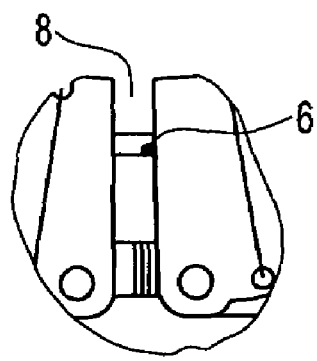
FIG. 2 illustrates an enlarged fragmentary view of the magnetic sensor system of FIG. 1 showing the magnetoresistive sensor placed in an air gap provided in the PWB.

As best shown in FIG. 2, which illustrates an enlarged fragmentary plan view of the MR sensor placed in an air-gap provided in the PWB of FIG. 1, the PWB 3, including the compensating conductor 5, has an air gap 8 formed therein for receiving the MR sensor 6 such that the compensation conductor 5 can be magnetically coupled to the MR sensor.

Electrical circuitry 9, formed on the circuit board 4 and electrically connected to the MR sensor 6 and compensating conductor 5, is adapted and arranged to detect a MR sensor output signal representing the input magnetic field generated by the primary conductor 2, and to accordingly feedback current to the compensating conductor 5 so as to generate a compensating magnetic field at the magnetic sensor 6.

Figure 3A:
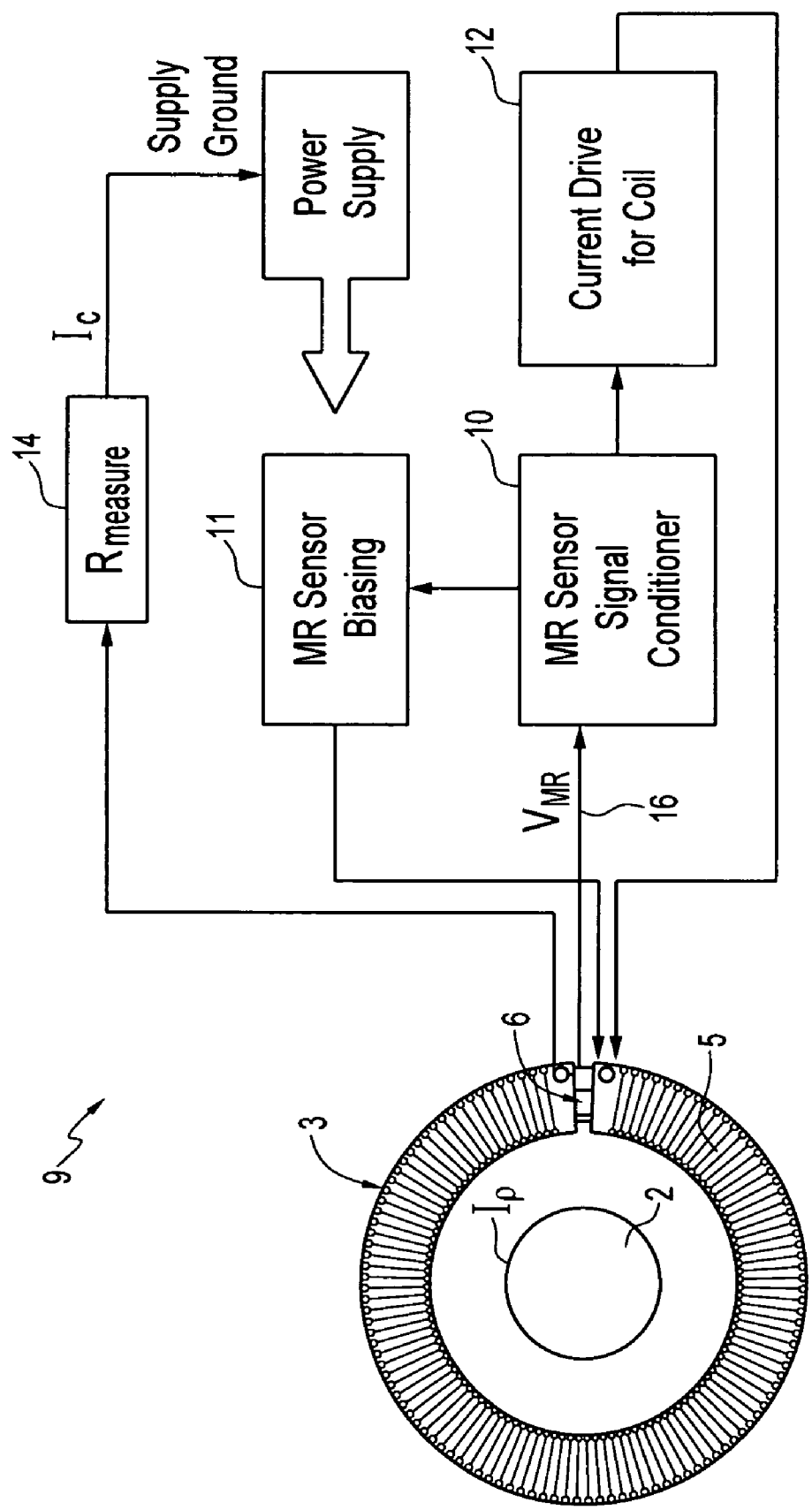
FIG. 3A illustrates a block diagram of the magnetic sensor system control circuitry.

As shown in FIG. 3A, which illustrates a block diagram of the principal parts of the sensor system electrical circuitry, the electrical circuitry 9 includes a signal conditioner 10 electrically coupling the MR sensor output 16 ($V_{MR}$) to a MR biasing circuit 11 and a current drive circuit 12 for driving feedback current through the compensating conductor 5. One end of the compensating conductor 5 is connected to current drive circuit 12 and the other end of the conductor 5 is connected to a measure or load resistor 14.

Figure 3B:
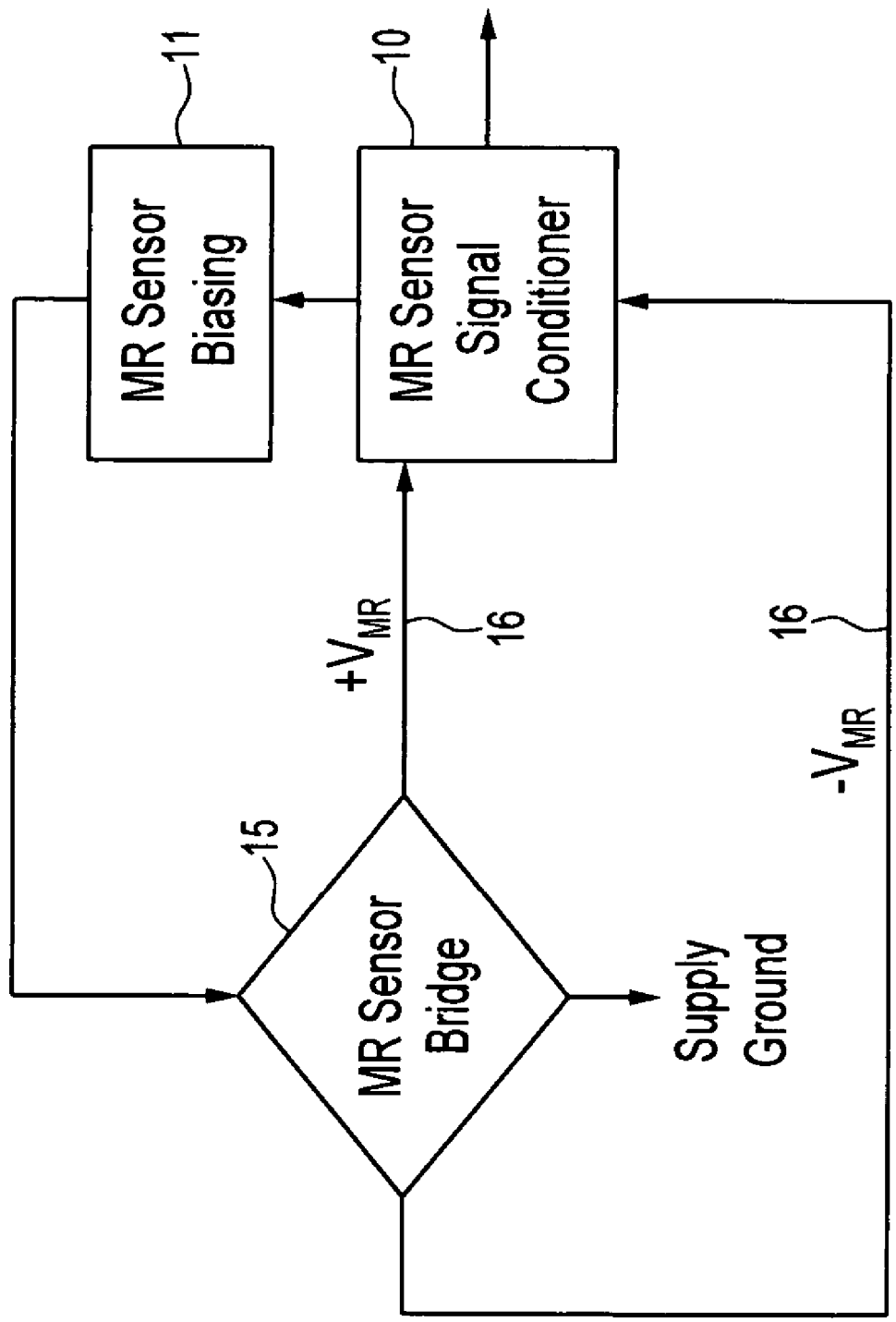
FIG. 3B illustrates a block diagram outlining the circuitry connecting the MR sensor itself to the biasing/conditioning circuitry shown in FIG. 3A.

As best shown in FIG. 3B, which illustrates a block diagram showing in more detail the electrical connection between a bridge of the MR sensor and the biasing/conditioning circuitry shown in FIG. 3, the MR sensor 6 is configured in a Wheatstone bridge 15 having a pair of opposite points connected to the signal conditioner circuit 10 and the other pair of opposite points connected to supply ground and the biasing circuit 11, respectively. The output is the compensation current $I_c$ that, when applied across resistor 14, yields a proportional output voltage. Detailed designs of such closed loop sensor circuits are known to those skilled in the art. For example, U.S. Pat. 6,566,856 B2, entitled "Closed-loop magneto resistive current sensor system having active offset nulling", issued to Sandquist et al on May 20, 2003 and incorporated herein by reference discloses such circuits.

Figure 4:
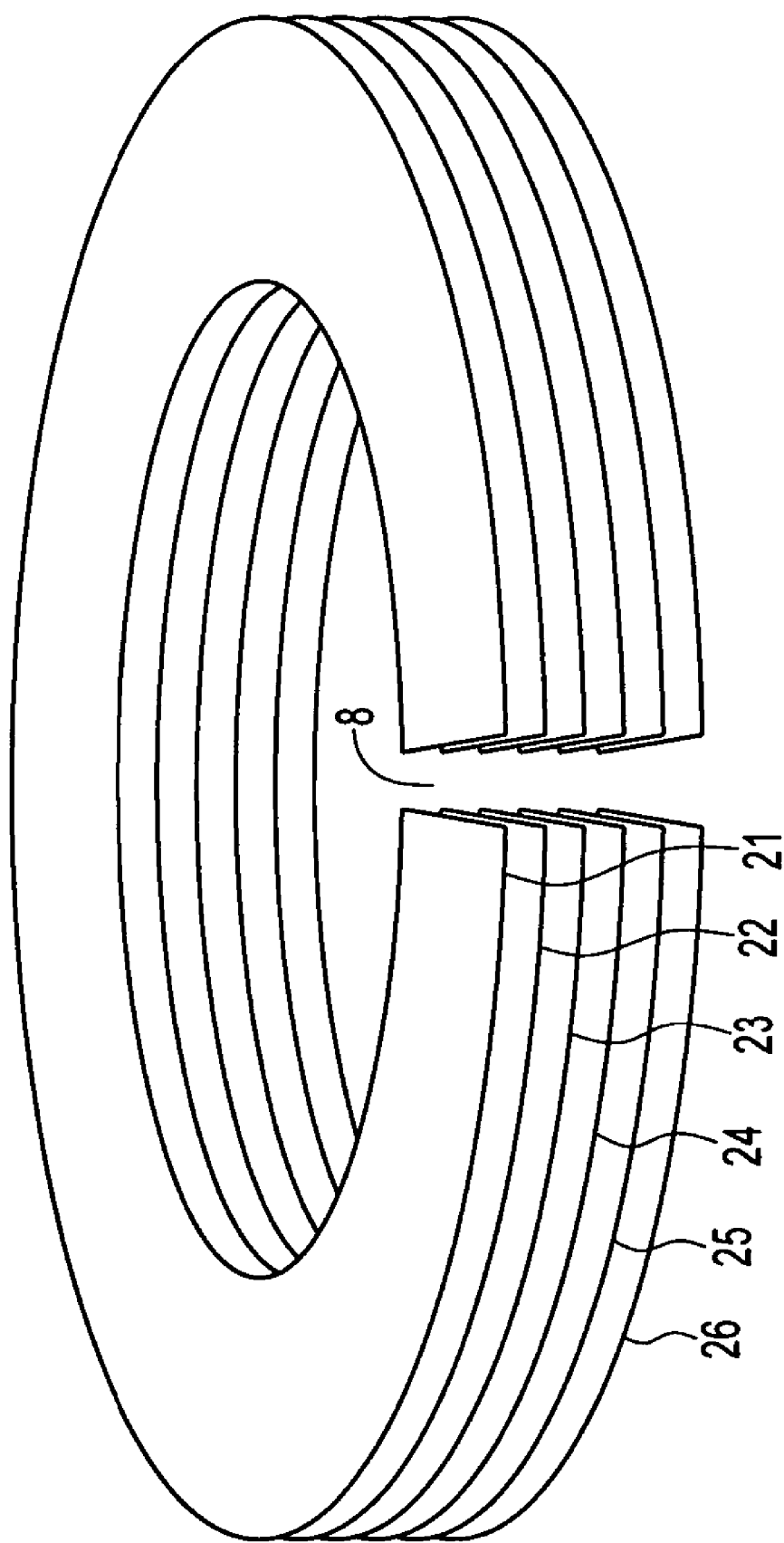
FIG. 4 illustrates a perspective view of the layers of the PWB of FIG. 1 but with the conductive traces omitted.

Referring to FIG. 4, which illustrates a perspective view of layers of the PWB of FIG. 1, the PWB 3 is made up of a plurality of stacked layers, in this particular embodiment, six layers 21,22,23,24,25,26. Dielectric material (not shown) interposes the stacked layers. As best shown in FIGS. 6A-F, which respectively illustrate plan views of each individual stacked layer showing the arrangement of the conductive traces and links therein, conductive traces 30,34,38,39,35,31, consisting of transversely extending metal stripes, are embedded spaced apart in rows along stacked layers 21,22,23,24,25,26, respectively.

Figure 5A:
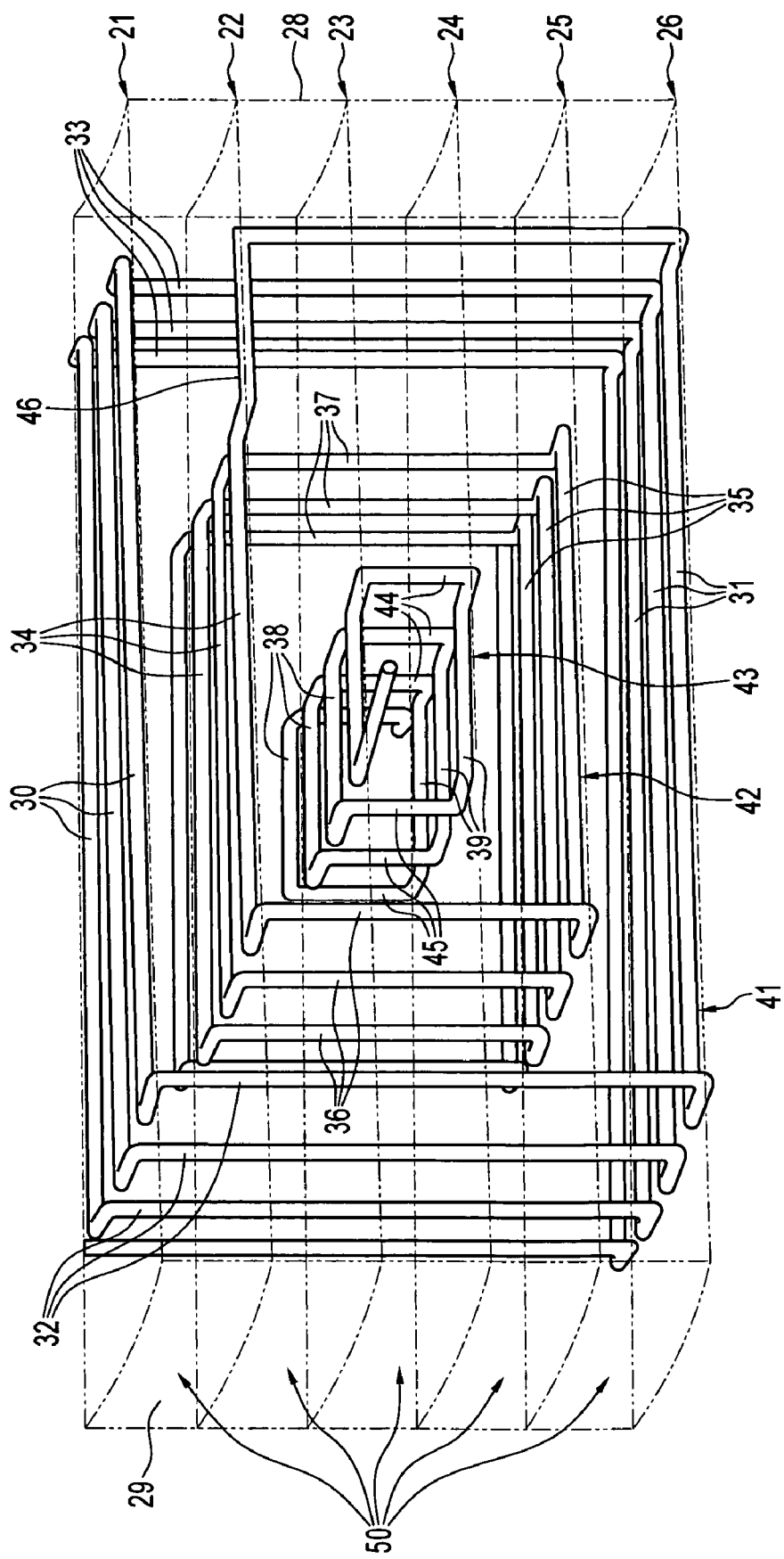
FIGS. 5A & 5B illustrate perspective and cross-sectional views of a segment of the PWB of FIG. 1 showing nested coils formed therein.
Figure 5B:
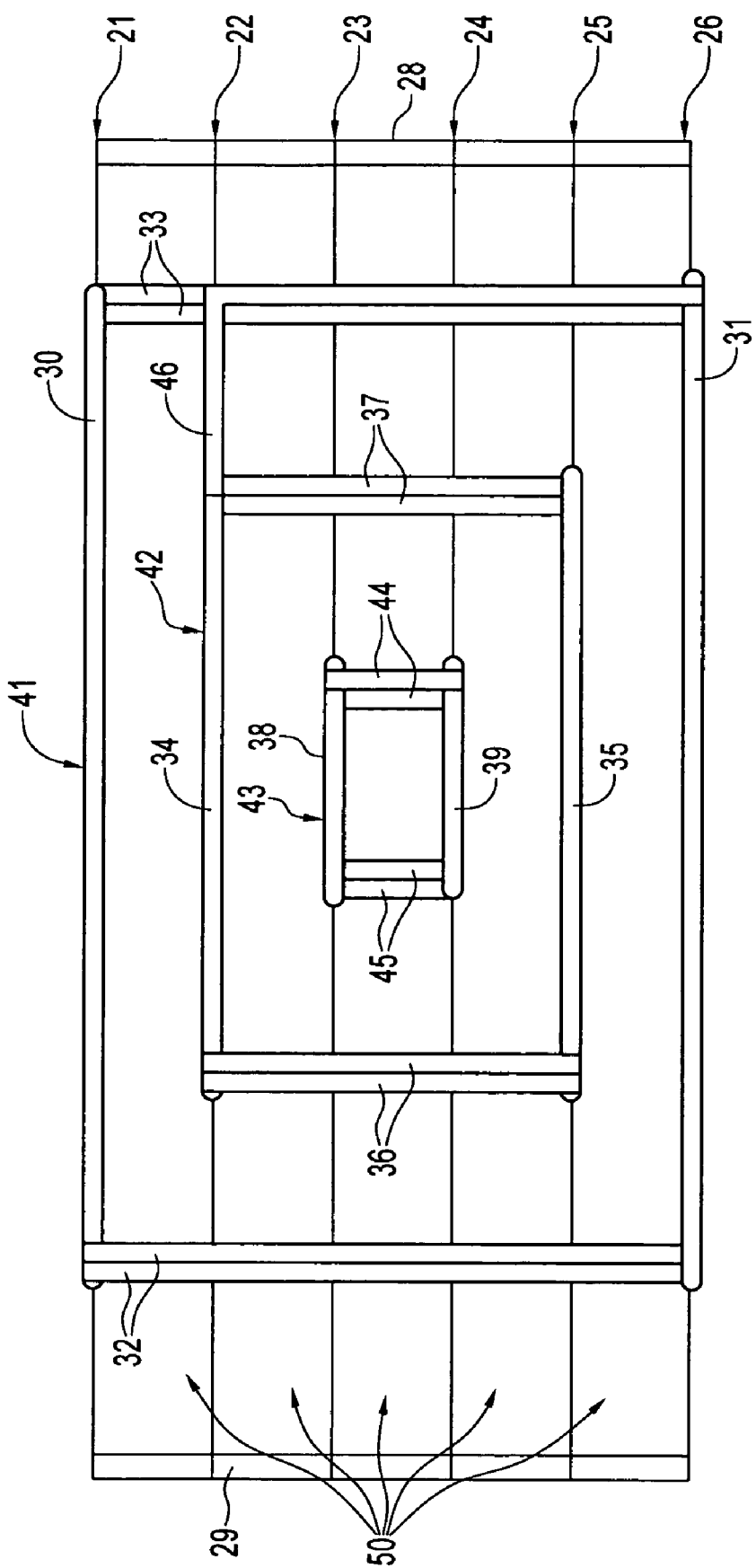
Figure 6B:
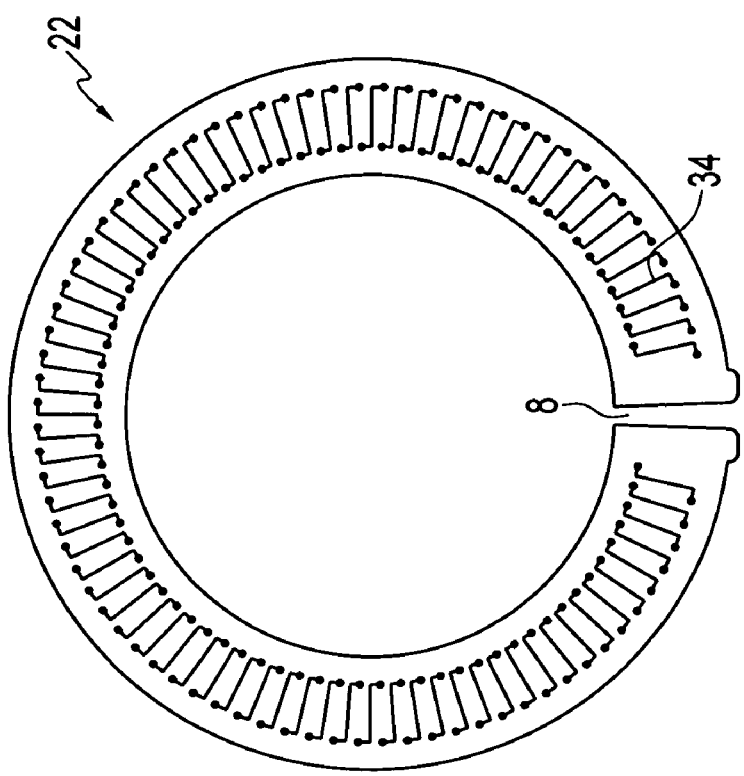
FIGS. 6A to 6F illustrate plan views taken from above of each of the individual layers of the printed circuit board of FIG. 1.
Figure 6A:
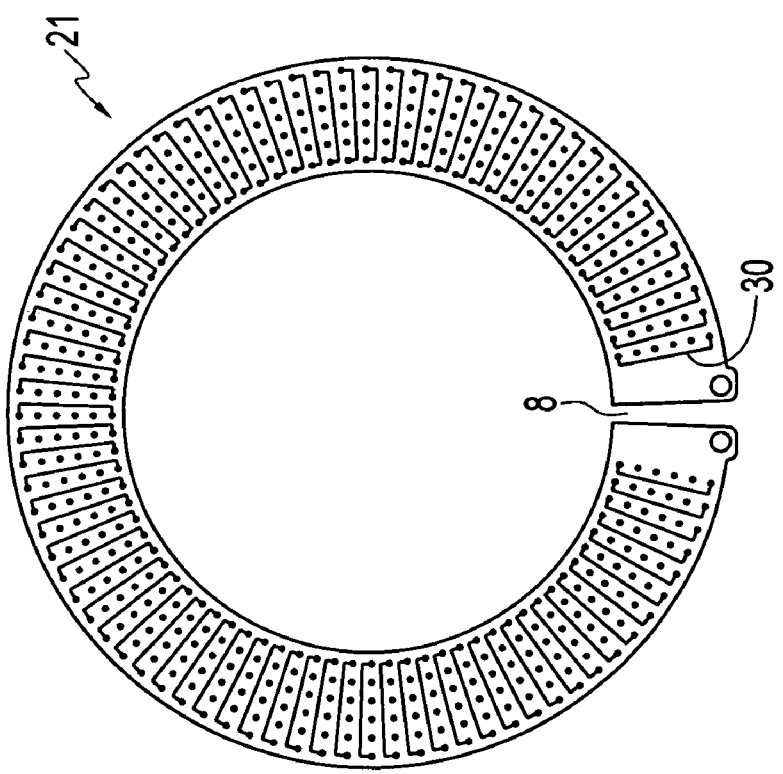
Figure 6D:
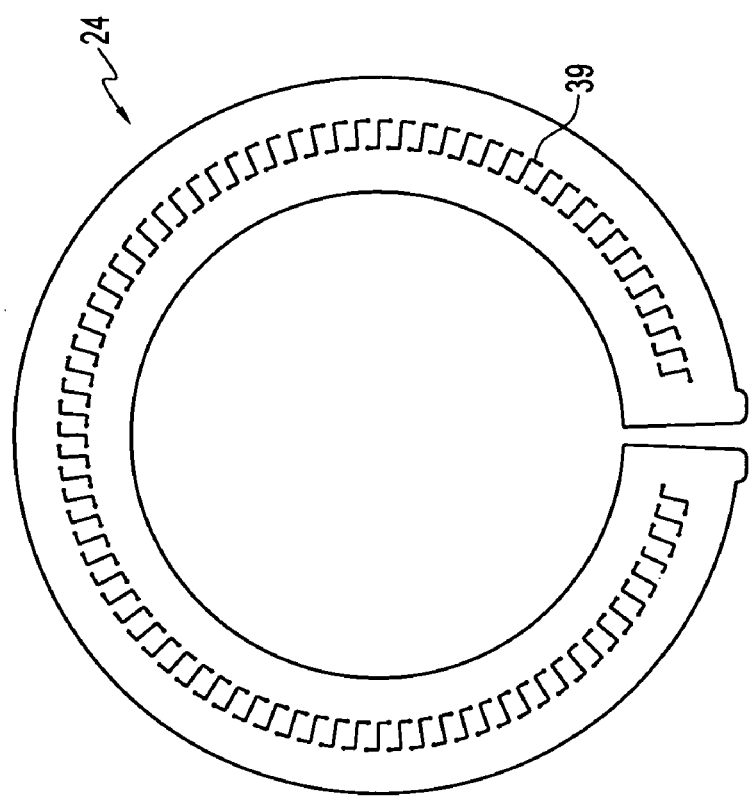
Figure 6C:
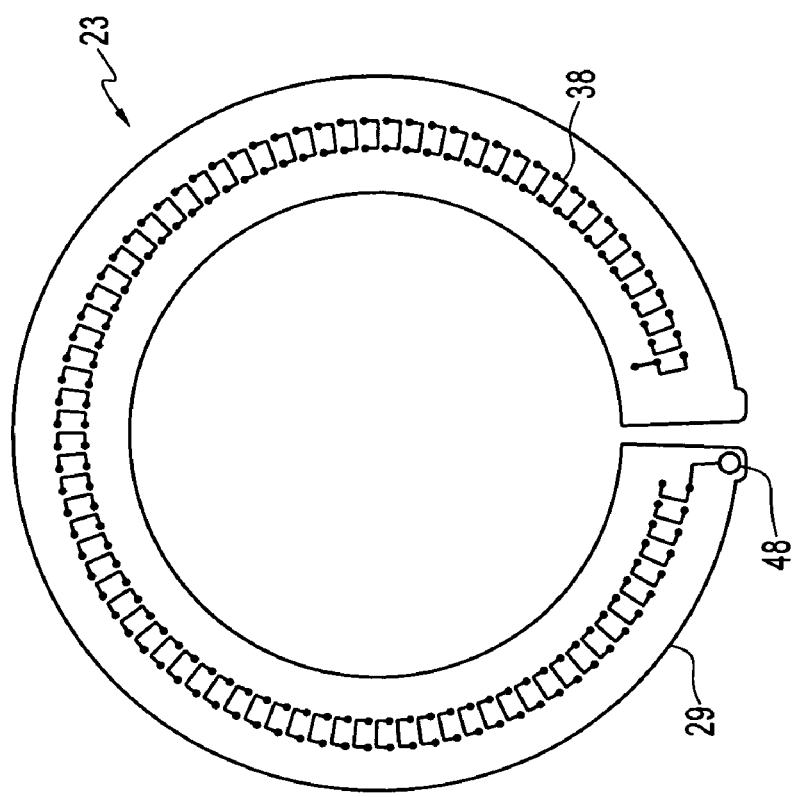
Figure 6F:
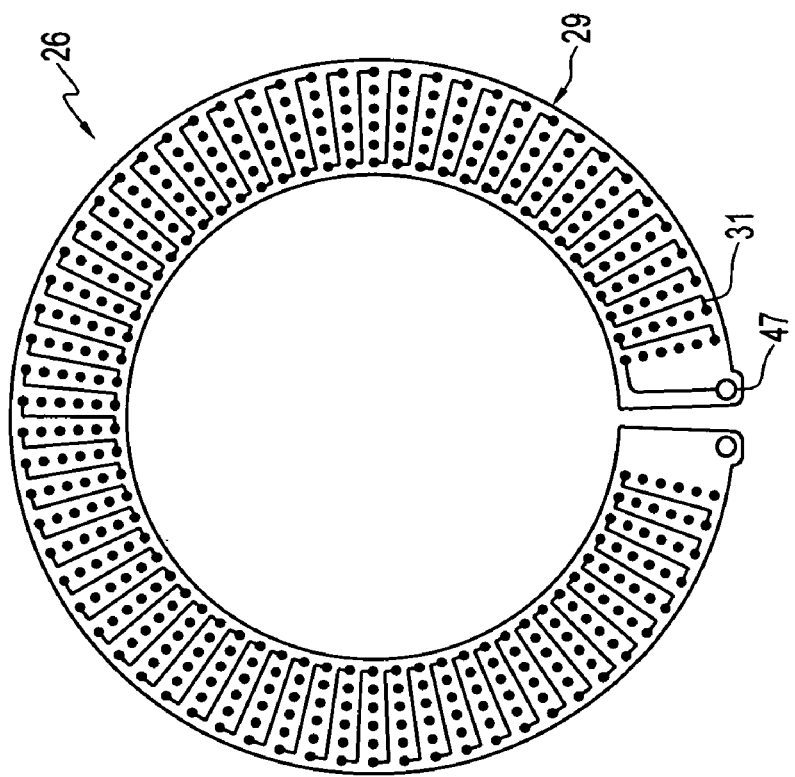
Figure 6E:
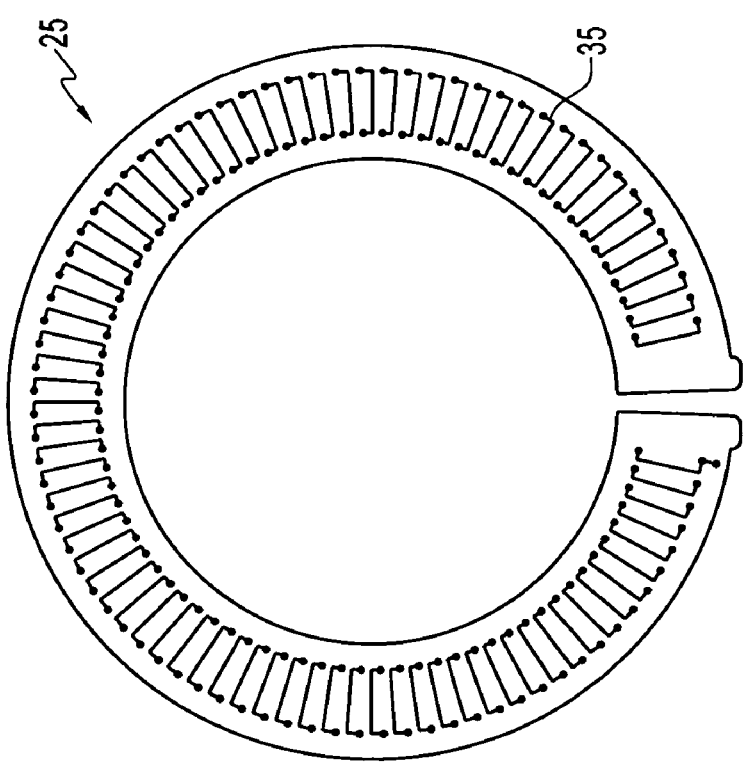

In order to explain how the conductive traces are arranged and linked together in the PWB 3, reference will now be made to FIGS. 5A & 5B which, respectively illustrate perspective and cross-sectional views of a segment of the PWB depicted nested coils formed therein. As will be explained in more detail below, the conductive traces in each pair of layers are arranged and alternately linked together in electrical series so as to form three nested circumferentially extending coils 41, 42, 43, in the PWB 3.

Stacked layers 21, 22, 23, 24, 25 ,26, each separated by dielectric 50, are arranged in pairs; the pair of innermost stacked layers 23,24 form one pair, the next layers 22,25 directly adjacent each of the innermost stacked layers 23,24, form a second pair, and the pair of outermost stacked layers 21,26 form a third pair.

Reference will be made to the outer coil 41 shown in FIG. 5A for the purpose of explaining how the conductive traces of each pair of layers are linked together to form a coil. In the pair of outermost layers 21, 26, the conductive traces 30, 31 have inner and outer ends located proximate inner and outer circumferential edges 28, 29 of the PWB, respectively. Inner ends of conductive traces 31 are connected by vias 33 up through other layers to respective inner ends of conductive traces 30 thereabove and outer ends of the conductive traces 30 are connected by vias 32 back down to outer ends of the next conductive traces 31 therebelow. By arranging the conductive traces 30,31 in this manner and alternately linking the conductive traces 30,31 together in this manner, a plurality of coil turns are formed in the PWB defining a first circumferentially extending coil 41

Conductive traces 34, 35 in the next pair of outer layers 22, 25, directly adjacent the respective outermost layers 21, 26, are arranged and alternately linked by vias 36, 37 so as to form a second circumferentially extending coil 42 nested within the first coil 41, and conductive traces 38,39 of the innermost pair of layers 23, 24, are arranged and alternately linked by vias 44, 45 so as to form a third circumferentially extending coil 43 nested within the second coil 42.

Additional vias 46 connect the first coil 41 in electrical series with the second coil 42 and the second coil in electrical series with third coil 43 such that the nested coils form the single compensating conductor 5. A conductive trace 31 of the outermost layer 26, defining the free end the first coil 41, is electrically connected to via 47 located on the PWB towards the outer circumferential edge 29 on one side of the air gap 8 (see in particular FIG. 6F). A conductive trace 38 on the innermost layer 23, defining the free end of the third coil 43, is electrically connected by a via 48 located on the PWB towards the outer circumferential edge 29 on the other side of the air gap. The sensor system circuitry 9 and the compensating conductor 5 are connected together by soldering the vias 47,48 to respective corresponding vias located on the circuit board 4 (see FIG. 1)

The PWBs can be manufactured using printed wire board or printed circuit board technologies known in the art. FIG. 5A shows the compensating conductor 5 configured as 3 nested coils 41, 42, 43, however, the compensating conductor 5 can have any number of coils as is required to obtain the desired magnetic sensor system performance. Additionally, nested coils can be provided in the PWB by simply adding additional pairs of layers and arranging the conductive traces and vias in the aforementioned manner. Furthermore, those skilled in the art would understand that the conductive traces of the layers shown in FIG. 5A can be arranged in many different ways so as to provide a compensating conductor configured as coils, or any other appropriate configuration, which can provide the required compensating magnetic field at the MR sensor.

Providing the magnetic sensor system with compensating conductor coils embedded in a PWB enables the MR sensor to sensitively and accurately measure the current flowing through the primary conductor without requiring a magnetic core to concentrate the input magnetic field or the compensating magnetic field. Consequently, problems associated with magnetic cores such as, core saturation, residual magnetism, thermal drift, eddy losses are circumvented.

Advantageously, the development cost and time in assembling the magnetic core in the magnetic sensor system is also eliminated. For example, the process steps of stamping, stacking of laminations, coil winding and core holding are no longer required. The magnetic sensor system 1 can be manufactured with a smaller number of materials and associated process costs so that the production yield can be improved. Also, the magnetic sensor system 1 is compact and lightweight and the shape of the magnetic sensor system 1 can be made the same for all the current range compared to present current sensors using a magnetic core.

The method of operating the magnetic sensor system of FIG. 1 will now be described. Initially, the magnetic sensor system is arranged so that the annular PWB 3 is coaxially aligned with and surrounds the primary conductor 2. This is achieved by means of mechanical positioning the primary conductor 2, for example, by arranging the conductor 2 as a fixed conductor (bus bar) in a housing or by using a self aligning fixture in the housing which ensures the primary conductor 2 is coaxially aligned with respect to the PWB 3. Current flowing through the primary conductor 2 generates the input magnetic field at the MR sensor 6 causing the MR sensor to generate an output signal representing the input magnetic field which, in turn, is processed by the electrical circuitry 9.

In response, the MR sensor biasing circuit 11, together with the current drive circuit 12, can drive a compensating current through the compensating coils 41, 42, 43 of the PWB 3 which, in turn, generates a compensating magnetic field opposing the input magnetic field at the MR sensor. The electrical circuit 9 increases the magnitude of the current feedback through the coils until the generated compensating magnetic field substantially cancels or nullifies the input magnetic field at the MR sensor 6 so that the MR output signal becomes substantially zero. Under such circumstances the relationship between the primary current $I_p$ and the compensating current $I_c$ can be described by the following equation:

$$N_p * I_p \alpha N_c * I_c \quad (1)$$

Where $N_p$ is number of primary conductor turns and $N_c$ is number of coil turns in the PWB.

Also, there is yet another relation ship between magnetic field B produced by the primary conductor and the position of the primary conductor:

$$B = \mu_o * N_p * I_p / 2 * \pi * R \quad (2)$$

i.e. $B \alpha 1/R$, where, $\mu_o$=permeability, $N_p$=primary conductor turns, $I_p$=primary current, R=radial distance between primary conductor & MR sensor. Thus, the sensitivity of the magnetic system 1 in detecting primary current can therefore be varied by varying the PWB coil turns, by varying the compensation current, and/or by varying the position of the primary conductor with respect to MR sensor 6.

By the electrical circuitry measuring the resulting current flow through the coils 41, 42, 43, a measure of the input magnetic field is obtained by the magnetic sensor system 1. The linearity of the system 1 is high compared to the conventional current sensor because of the absence of magnetic field concentration. Unlike in conventional techniques, there is no flux concentration resulting from a magnetic core so that the current required for the cancellation of primary flux is less, resulting in lower power loss.

Equation (1) indicates that as the number of coil turns increases, the magnitude of current required to compensate the input magnetic field accordingly decreases. It is therefore preferable to design the PWB 3 with a high number of coil turns so as to provide a magnetic sensor system which is highly sensitive to the primary current. The total number of coil turns provided in the PWB 3 can be increased by increasing the density of coil turns along the length of the PWB and/or by increasing the number of nested coils by adding more layer pairs in the aforementioned manner.

By using the PWB 3 in the magnetic sensor system 1, it is possible to rely on the sensitivity of the MR sensor 6 to detect current flow through the primary conductor 2 without requiring concentration of the field at the MR sensor. Since no field concentration is used, the magnetic sensor system 1 does not exhibit remanence, increasing the overall accuracy of the system. Furthermore, the bandwidth of the magnetic sensor system 1 is higher than that of a current sensor with a ferrous core owing to reduced inductance associated with the dielectric of the PWB. Additionally, temperature dependent offset and core losses associated with magnetic core can be eliminated. Also advantageously, the response time of the magnetic sensor system 1 is excellent compared to conventional current sensor.

Figure 7:
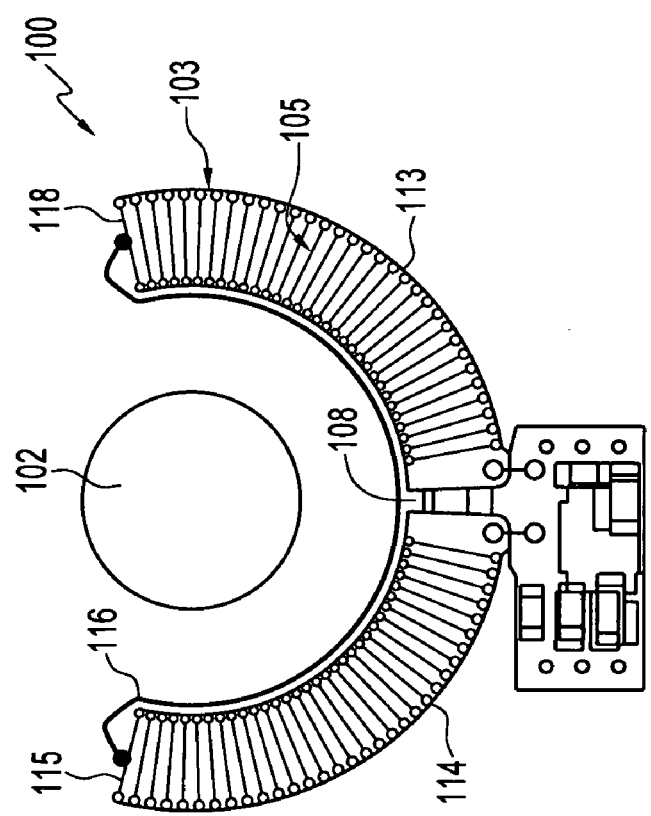
FIG. 7 illustrates a plan view taken from above a closed loop magnetic sensor system according to another embodiment.

Referring now to FIG. 7, which illustrates a magnetic sensor system according to another embodiment, the magnetic sensor system 100 is identical to the magnetic sensor system 1 of the first embodiment shown in FIG. 1 with the exception that the PWB 103 is shaped as a partial annular band rather than a complete annular band as shown in FIG. 1. The PWB 103 is formed as two similar accurate shaped sections 113,114 separated by the MR sensor receiving air gap 108. The compensating conductor 105 is configured as nested coils formed in a similar manner as the nested coils of the magnetic sensor system of the first embodiment. However, the nested coils are connected together in electrical series in each section and the nested coils of each section are, in turn, connected in electrical series by an electrical conductor 116 bridging the distal ends 115,118 of the accurate sections 113, 114.

By using a PWB 103 configured as a partially annular band, the magnetic sensor system 100 can be utilized to measure current through a primary conductor 102 in clamp type applications. Since the PWB 103 is only partially annular, the PWB can be placed in the measuring position in which the PWB is coaxially aligned with and partially surrounding the primary conductor 102 without having to disconnect one end of the primary cable, by simply positioning the free ends of the PWB either side of the primary conductor (see FIG. 7). The primary conductor 102 can be coaxially aligned with the PWB 103 in the same way as the primary conductor 2 is coaxially aligned with the PWB 3 of the first embodiment shown in FIG. 1.

Figure 8:
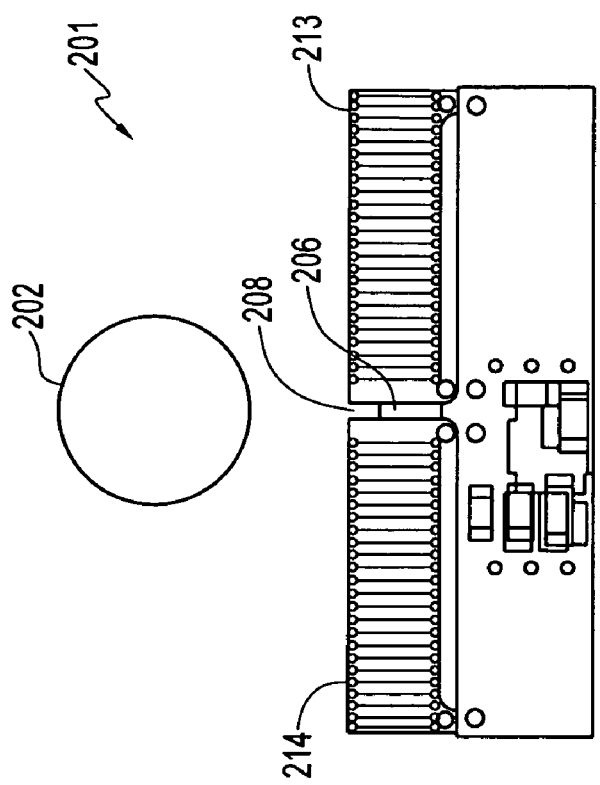
FIG. 8 illustrates a plan view taken from above a closed loop magnetic sensor system according to yet another embodiment.

The PWB sections 113, 114, can be formed as linear rather than annular sections, for example, as shown in FIG. 8, which illustrates another sensor system 201 according to yet another embodiment. The magnetic sensor system 201 of FIG. 8 is similar to that of the magnetic sensor system 100 of FIG. 7 shows that PWB has a pair of straight sections extending outwardly longitudinally either side of the PWB air gap 208. Such a PWB configuration is beneficial in applications in which the size of the magnetic sensor system must be minimized to enable measurement of the primary conductor current.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The invention claimed is:

1. A closed loop magnetic sensor system for measuring an input magnetic field from a magnetic field source, said magnetic sensor system comprising
a magnetic sensor for measuring said input magnetic field,
a compensation circuit, magnetically coupled to said magnetic sensor, wherein said compensation circuit comprises a compensating conductor carried on a printed wire board (PWB) or printed circuit board (PCB), wherein said magnetic sensor is arranged in an air gap provided in said PWB or PCB such that said compensating conductor is magnetically coupled to said magnetic sensor and
electrical control circuitry, electrically coupled to said magnetic sensor and said compensating conductor, said electrical control circuitry being adapted and arranged to drive a feedback current through said compensating conductor according to the output of said magnetic sensor such that said input magnetic field is substantially compensated at said magnetic sensor.

2. The magnetic sensor system of claim 1, wherein said compensating conductor comprising conductive wires or traces, disposed in or on said PCB or PWB, and vias linking said conductive traces together.

3. The magnetic sensor system of claim 1, wherein said magnetic sensor comprises a magnetoresistive (MR) sensor.

4. The magnetic sensor system of claim 1, wherein said compensating conductor is configured as at least one compensation coil.

5. The magnetic sensor system of claim 1, wherein said compensating conductor is configured as a plurality of nested coils.

6. The magnetic sensor system of claim 1, wherein said compensating conductor is configured as at least one coil carried on or in said PWB.

7. The magnetic sensor system of claim 6, wherein said printed wire board comprises a plurality of stacked layers, each of said stacked layers being separated by dielectric material, and wherein said conductive traces are arranged in said stacked layers and are linked by said vias to form said coil(s).

8. The magnetic sensor system of claim 1, wherein said PCB or PWB is shaped as a band to enable the PCB or PWB to partially or completely surround a primary conductor of the magnetic field source.

9. A closed loop magnetic sensor system for measuring current flowing through a primary conductor, said magnetic sensor system comprising
a magnetic sensor for measuring magnetic flux associated with said primary conductor,
a compensation circuit, magnetically coupled to said magnetic sensor, wherein said compensation circuit comprises a printed wire board (PWB) or printed circuit board (PCB) having a compensating conductor carried thereon, said magnetic sensor being arranged in an air gap provided in said printed wire board or printed circuit board such that said magnetic sensor can be magnetically coupled to said compensating conductor, and
electrical control circuitry, electrically coupled to said magnetic sensor and said compensating conductor, said electrician control circuitry being adapted and arranged to drive a feedback current through said compensating conductor according to the output or said magnetic sensor such that such that said input magnetic field is substantially compensated at said magnetic sensor.

10. The magnetic sensor system of claim 9, wherein said magnetic sensor comprises a magnetoresistive (MR) sensor.

11. The magnetic sensor system of claim 9, wherein said compensating conductor comprises conductive wires or traces, printed on said PWB or PCB, and vias linking said conductive traces together.

12. The magnetic sensor system of claim 11, wherein said compensating conductor is configured as at least one coil carried on said PWB.

13. The magnetic sensor system of claim 11, wherein said printed wire board is shaped as a partial or complete annular or polygonal band such that, when said printed wire board is positioned substantially coaxially with said primary conductor, said printed wire board partially or completely surrounds said primary conductor with a gap formed therebetween.

14. The magnetic sensor system of claim 11, wherein said printed wire board comprises first and second portions extending outwardly away from said air gap, said air gap separating opposing ends of said first and second portions.

15. The magnetic sensor system of claim 11, wherein said printed wire board comprises a plurality of stacked layers, each of said stacked layers being separated by dielectric material, wherein said conductive traces are embedded in said layers and wherein said vias link conductive traces in different layers.

16. The magnetic sensor system of claim 15, said stacked layers comprise a pair of innermost stacked layers and at least one next pair of layers, each layer of said next pair(s) of stacked layers being disposed on each corresponding layer of said innermost pair of layers, said conductive traces of said pair of innermost stacked layers being linked together by said vias to form one coil and said conductive traces of said next pair(s) of stacked layers being linked together to form the or each next coil, said coils extending substantially along the length of said PWB and being linked and nested together so as to form said compensating conductor.

17. A compensation circuit board for generating a compensating magnetic field in the vicinity of a magnetic sensor, said compensation circuit comprising, a printed wire board or printed circuit board having an air gap provided therein for receiving a magnetic sensor for sensing an input magnetic field, a compensating conductor carried on said printed wire board, said compensating conductor comprising conductive wires or traces linked together by means of vias, wherein, when said magnetic sensor is received in said air gap, said compensating circuit can be driven with current to generate a compensating magnetic field substantially to compensate said input magnetic field at said magnetic sensor.

18. The compensation circuit board of claim 17, wherein said compensating conductor is configured as at least one coil in said printed wire board.

19. The compensation circuit board of claim 18, wherein said printed wire board comprises a plurality of stacked layers, each of said stacked layers being separated by dielectric material, and wherein said conductive traces are arranged in said layers, said conductive traces of different layers being linked by said vias to form said coil(s).

* * * * *